United States Patent
Lee et al.

(10) Patent No.: US 9,209,786 B1
(45) Date of Patent: Dec. 8, 2015

(54) IMPEDANCE TUNERS WITH POSITION FEEDBACK

(71) Applicant: Maury Microwave, Inc., Ontario, CA (US)

(72) Inventors: Byung Lee, Corona, CA (US); Gary R. Simpson, Fontana, CA (US); Sathya Padmanabhan, Glendora, CA (US)

(73) Assignee: Maury Microwave, Inc., Ontario, CA (US)

( * ) Notice: Subject to any disclaimer, the term of this patent is extended or adjusted under 35 U.S.C. 154(b) by 0 days.

(21) Appl. No.: 14/722,599

(22) Filed: May 27, 2015

Related U.S. Application Data

(60) Provisional application No. 62/006,113, filed on May 31, 2014.

(51) Int. Cl.
 *H03H 7/40* (2006.01)
 *H03J 1/08* (2006.01)

(52) U.S. Cl.
 CPC ... *H03J 1/08* (2013.01); *H03H 7/40* (2013.01)

(58) Field of Classification Search
 CPC ............... H01P 1/00; H01P 1/28; H01P 5/04; H03H 7/38; H03H 7/40
 USPC .................................... 333/32, 33, 17.3, 263
 See application file for complete search history.

(56) References Cited

U.S. PATENT DOCUMENTS

| | | | |
|---|---|---|---|
| 3,794,941 A | 2/1974 | Templin | |
| 5,072,198 A | 12/1991 | Taplin et al. | |
| 5,910,754 A | 6/1999 | Simpson et al. | |
| 6,850,076 B2 | 2/2005 | Tsironis | |
| 7,646,268 B1 | 1/2010 | Tsironis | |
| 8,358,186 B1 * | 1/2013 | Tsironis | ...................... 333/263 |
| 8,410,862 B1 | 4/2013 | Tsironis | |
| 2003/0122633 A1 | 7/2003 | Tsironis | |
| 2012/0049970 A1 | 3/2012 | Simpson | |
| 2012/0259911 A1 | 10/2012 | Meierer | |

OTHER PUBLICATIONS

International Search Report and the Written Opinion of the International Searching Authority, International application No. PCT/US2015/033192, mailed Oct. 16, 2015.

* cited by examiner

*Primary Examiner* — Stephen E Jones
(74) *Attorney, Agent, or Firm* — Larry K. Roberts

(57) ABSTRACT

An impedance tuner includes a controller, an RF transmission line, and a movable capacitive object configured for movement commanded by the controller relative to the transmission line to alter impedance. A position sensor is configured to provide feedback position data to the controller indicative of the actual position of the capacitive object after it is moved. The controller is configured to utilize the feedback position data in a closed loop to position the capacitive object at a desired position within a tolerance.

19 Claims, 8 Drawing Sheets

IMPEDANCE TUNERS WITH POSITION FEEDBACK

CROSS-REFERENCE TO RELATED APPLICATION

This application claims the benefit of U.S. Provisional Application No. 62/006,113 filed May 31, 2014, the entire contents of which are hereby incorporated by reference.

BACKGROUND

Impedance tuners are often used for testing, tuning and calibration of electronic devices. Also, impedance tuners are the most common method for radio frequency (RF) and microwave (MW) amplifiers to be tested for measurement of performance. Impedance tuners can be used on load-pull and noise measurements at microwave and millimeter-wave frequencies.

An Impedance tuner includes a transmission line, such as a slabline, coaxial line, or waveguide. Placement of capacitive objects such as probes along the transmission line alters the impedance or electronic profile seen by the device under test (DUT) which is connected or coupled to the tuner transmission line. The object may be placed axially along the transmission line to affect the phase, while movement of the object transverse to the transmission line will alter impedance magnitude or gamma effects. In automated tuners, motors are used to position the capacitive objects along the transmission line and transverse to the transmission line.

Using a motor to repeat the positional movement along and transverse to the transmission line is important for accuracy. With frequencies in the gigahertz (GHz) range, even small errors in placement of the objects or probes can be very significant.

Today's manual tuners use high precision micrometers to measure the distance traveled along the transmission line but they still require a user interface for positioning and are limited by the precision of the micrometer. On some known automated tuners, a location ("home") sensor is used as a reference start point and stepper motors are used to drive the object or probe along the transmission line axis and transverse to the transmission line. The stepper motor's complete rotation is divided into fractions similar to a pie. Each minor movement of the motor equals a slice of the pie. The motor stator includes wire coils that generate magnetic fields when electrically energized. The motor rotor typically also has magnets which respond to the magnetic fields. The magnetic field generated by the stator moves the rotor in segments of a full rotation. A stepper motor is driven by a series of electrical pulses, where each pulse causes the motor to rotate by the defined angle (a fraction of one full rotation). The amount moved can be easily calculated by counting the number of pulses that are sent. However, if the pulse produces insufficient current to move the motor such that the motor gets stuck and doesn't move, then the calculated position will be wrong.

The motor may be attached to a screw-like shaft, called a leadscrew, to propel a carriage. The carriage which supports the capacitive objects or probes travels along the screw-like shaft, by engagement with internal threads on the carriage. As the shaft is rotated by the motor the carriage moves in one direction. Reversing the motor will rotate the screw in the opposite direction, which moves the carriage in the opposite direction. Due to physical and material capabilities the cuts in the screw-like shaft ("threads") typically do not match identically to the internal threads on the carriage. Thus an error in movement when reversing directions becomes evident.

Another common approach is to drive the carriage using a gear on a linear rack gear, as shown in FIG. 8. As with the screw-like drive, minor mismatches in the gears and other manufacturing limitations will produce some uncertainty about the exact location where the carriage will stop, even if the motor shaft repeated perfectly. This open loop control used in the past limits the positional accuracy that is possible.

Another error that may happen is there may be a limitation that prevents the carriage from moving. If this is to occur, the rotor of the motor will not move even though the signal to the stator has been sent. This error in position will affect all other position requirements afterwards.

Mechanical impedance tuners may have multiple motors. The limitation of positional accuracy described above applies to each motorized axis of an impedance tuner separately. FIG. 1 shows only one motor for simplicity of explanation, but the principle applies to any motorized component of an impedance tuner.

A common tuner configuration uses a carriage which moves parallel to the transmission line, and one or more motors mounted on that carriage to move capacitive objects transverse to the transmission line. A capacitive object mounted on the carriage moves parallel to the transmission line when the carriage moves, and is moved transverse to the transmission line by a separate motor mounted on the carriages with the capacitive object. This allows the capacitive object to move in two dimensions independently. In this case, the mass of the loaded carriage is much more than one capacitive object. The larger mass requires more motor force to move, and therefore may be more susceptible to stalling or not moving correctly for every pulse sent to the stepper motor.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
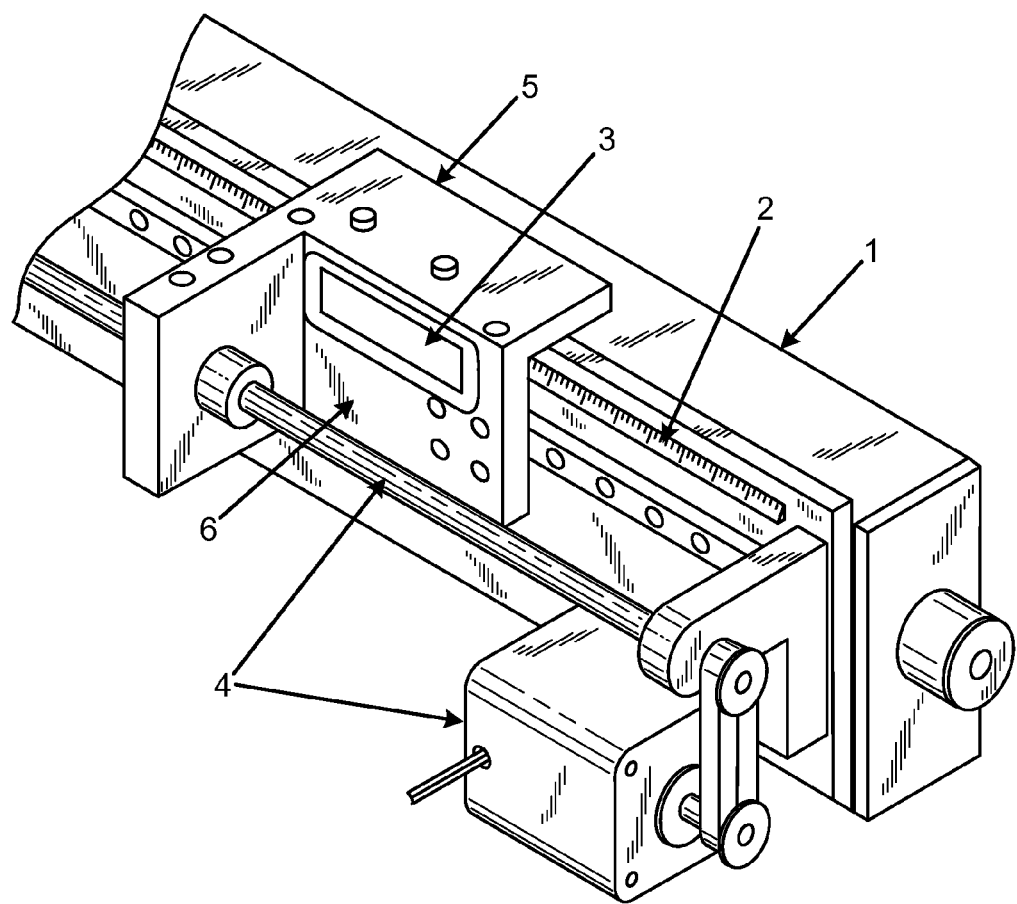
FIG. 1 is a diagrammatic isometric view of a portion of an exemplary embodiment of an impedance tuner.

In the following detailed description and in the several figures of the drawing, like elements are identified with like reference numerals. The figures may not be to scale, and relative feature sizes may be exaggerated for illustrative purposes.

FIG. 1 shows an exemplary embodiment of an assembly with a feedback loop (closed loop system) incorporated in an impedance tuner. The feedback loop will help identify and accurately move objects to their intended position with finer repeatability than currently available impedance tuners. The exemplary embodiment includes the impedance tuner generally indicated as (1), an encoder scale (2), a sensor (3) configured to read the encoder scale and mounted on a movable carriage (6), a motor and screw shaft (4) configured for movement, and the moving items (5) located on an impedance tuner carriage. Typically the movable objects may include not only the movable carriage (6), but also a capacitive probe and probe motor mounted to the carriage and configured to move the probe in a transverse direction relative to the screw shaft. Exemplary impedance tuners with electronic controllers, application software, drivers, motors and carriages are described, for example in US 2012/0049970, entitled Systems and Methods for Impedance Tuner Initialization, the '970 publication, the entire contents of which are incorporated herein by this reference.

Figure 2B:
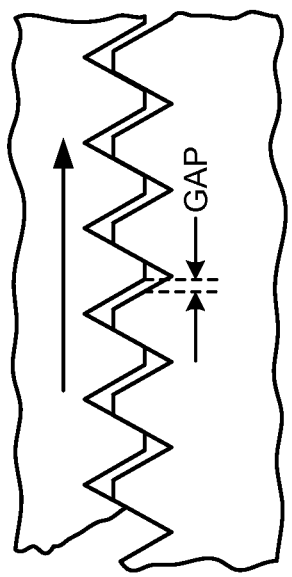
FIGS. 2A and 2B diagrammatically illustrate the threads on a screw mated to internal threads on a carriage, illustrating imperfections in the mating of the adjacent thread surfaces.
Figure 7:
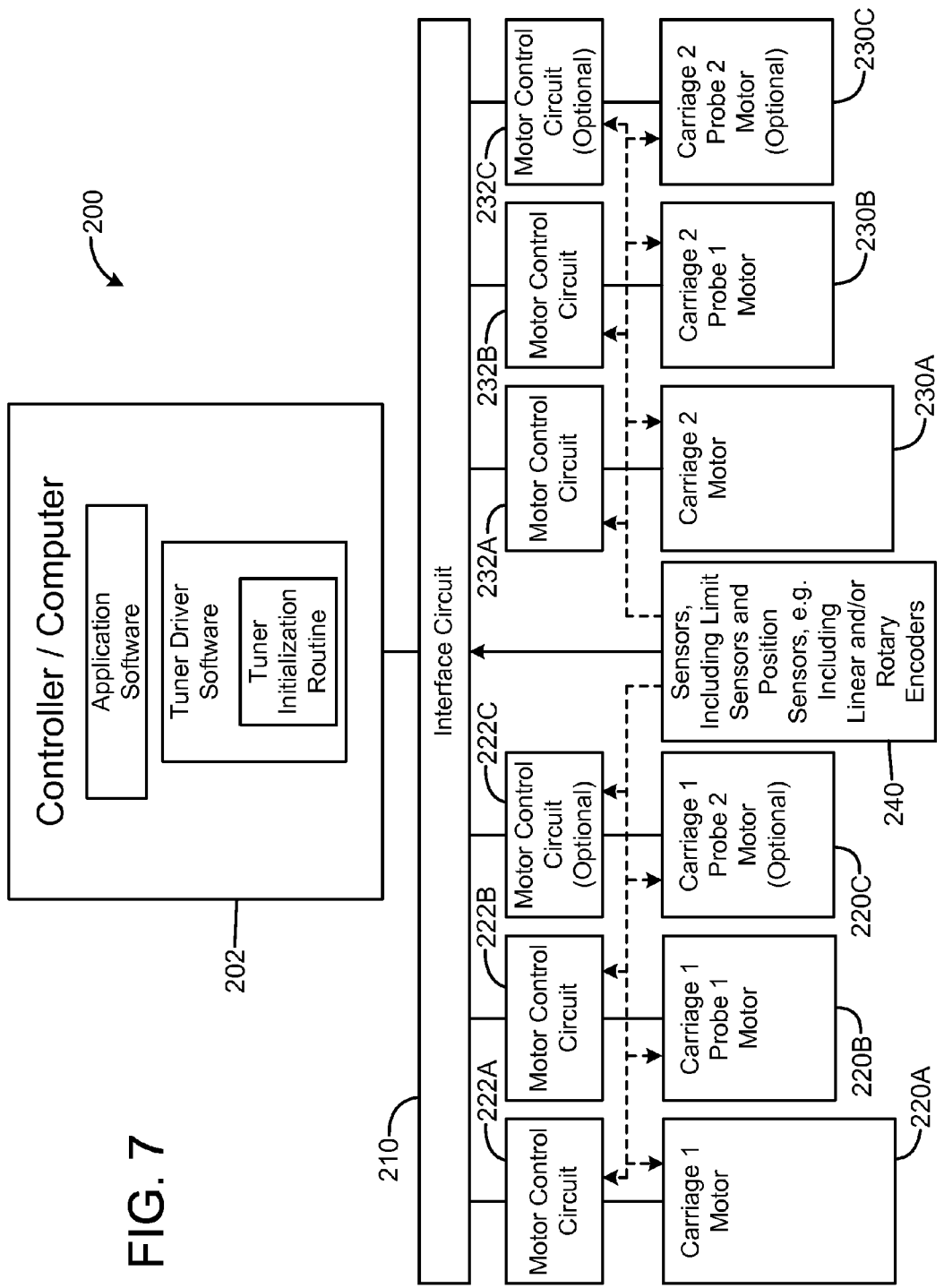
FIG. 7 illustrates a control system including a controller/computer, programmed with application software and tuner driver software, and utilizing position sensors.
Figure 8:
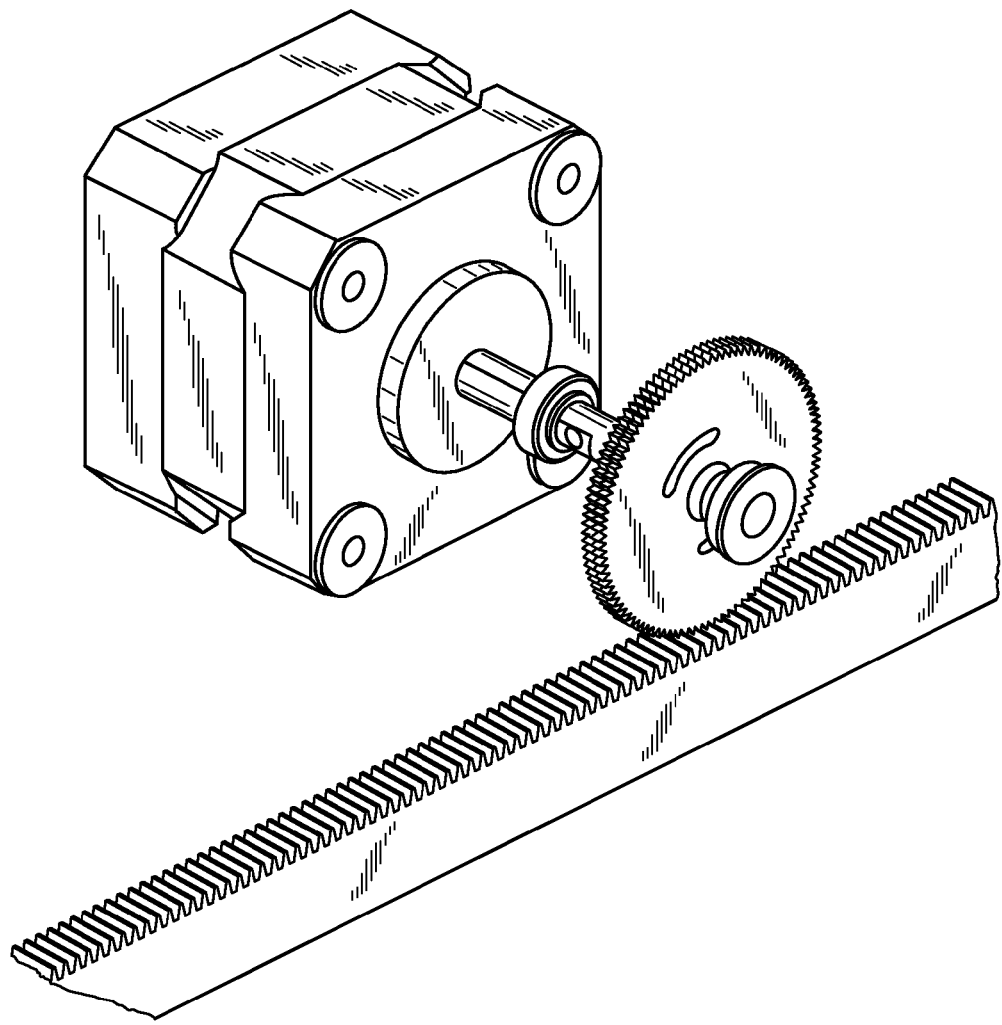
FIG. 8 illustrates a common approach to drive an impedance tuner carriage using a gear on a linear rack gear.

FIG. 2B of the '970 publication shows a schematic diagram of an exemplary controller/computer which controls operation of an impedance tuner, and a corresponding schematic diagram is set out herein as FIG. 7, incorporating position sensors. FIG. 7 illustrates a control system 200 including a controller/computer 202, programmed with application software and tuner driver software, and sensors 240 including limit sensors and position sensors for sensing the positions of the movable objects (carriages, probes) whose movements are commanded by the controller/computer. While FIG. 7 illustrates an example of a tuner control system for a two carriage system (carriage 1 and carriage 2) with two probes per carriage, the system may be used with a single carriage tuner or a multiple carriage tuner, with one or multiple probes. Each carriage will typically have its own sensor, and multiple carriages may read a single common scale. Alternatively, a separate scale may be provided for each carriage.

In a general sense, the impedance tuner includes a position sensor to sense the actual position of the movable object (such as a carriage or probe), or a position indicative of the actual position, after it has been moved under command by the controller.

Referring to FIG. 1, the position sensor includes the encoder scale (2) and sensor (3). The sensor (3) may be an optical sensor for reading the scale, for example. The encoder scale (2) is illustrated with coarser scale increments than would typically employed in a given application for clarity of illustration.

Conventionally, sensors were used only to detect travel past a movement limit. In the example shown in FIG. 7, the sensors 240 include position sensors connected through the interface circuit 210 to the controller/computer, and also optionally to some or all of the motors 220A, 220B, 220C, 230A, 230B, 230C, and also to some or all of the motor control circuits 222A, 222B, 222C, 232A, 232B, 232C. The carriage 1 and 2 motors 220A, 230A are configured to move the carriages 1 and 2 parallel to the transmission line. Each carriage may include two probes and probe motors 220B, 220C, 230B, 230C, which are configured to move the respective probes in directions transverse to the transmission line. The position sensors may include sensors which provide electronic signals to the controller indicative of the positions of the carriages and the probes after they have been moved by the respective motors. The motors may be stepper motors, although other motor types, such as DC motors, may be employed.

Figure 2A:
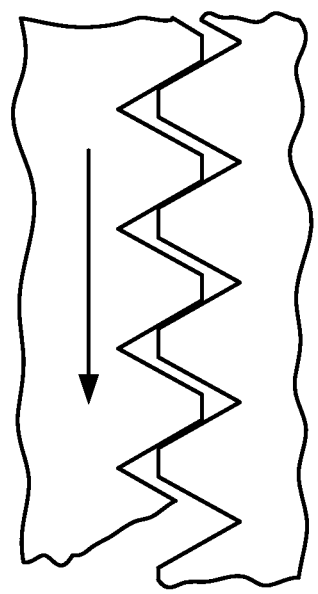

FIGS. 2A and 2B show the imperfections on a screw to nut mating. The lower threads represent the leadscrew threads, and do not identically match the upper threads representing the internal nut threads of the carriage. As the leadscrew is rotated in one direction in FIG. 2A, the nut moves in a corresponding direction, and a gap (so marked in FIG. 2A) is formed between the mating threads. When the leadscrew is rotated in the opposite direction (FIG. 2B), the nut moves in the opposite direction, and the gap introduces an error in position. This error (see also FIG. 3) adversely affects the repeatability of positioning of the carriage mount.

The impedance tuner illustrated in FIG. 1 utilizes a motor and screw combination to move items mounted parallel to or transverse to the transmission line. With high frequency wavelengths, movements must be finite and at small increments. Using motors and screw shafts, with their inherent flaws, can only achieve a fraction of resolution needed.

Figure 3:
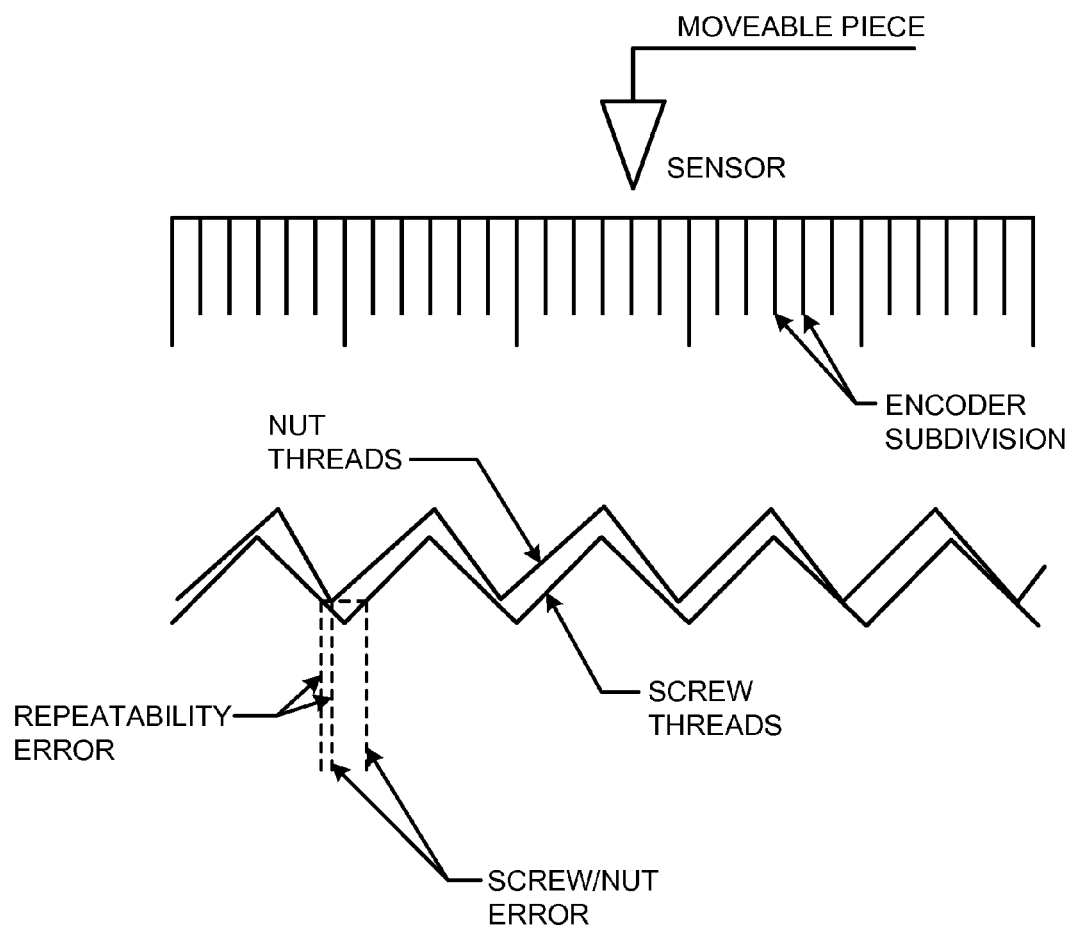
FIG. 3 diagrammatically illustrates positional location using a screw/nut system and encoder scale system.

The position sensor with encoder scale (2) offers position resolution that meet or exceed the resolution of motor/screw movement needed on an impedance tuner. The encoder scale is essentially a ruler that is divided in many segments. Each encoder scale's major division is divided into subdivisions. Each subdivision group acts like a bar code. Each bar code combination is read by the sensor to signal its location. See FIG. 3, showing the sensor encoder scale, and the movable piece or object (the carriage in this embodiment). Typical position sensors may employ optical techniques to sense the location or position utilizing the scale, and generate electronic sensor signals that can be read by the controller. Other types of position sensors, e.g., magnetic sensors, may alternatively be employed.

The position sensor may employ an absolute encoder or a relative encoder. An absolute encoder is one where the absolute position may always be read from the encoder without any prior knowledge of the current position. A relative encoder is one that repeats periodically. A relative encoder gives a precise location within one section of movement, but it is necessary to know the current section of the overall travel in order to calculate the absolute position. An example of a relative encoder is a rotary encoder that indicates motor angle precisely. If the total travel requires multiple rotations of the motor, then the distance of one full motor rotation would be one section of the total travel. In this case, the section (or number of motor rotations) must be kept track of separately. If the number of motor rotations from a reference position is R, and the number of steps per rotation is M1, and the rotary encoder reading is E, then the absolute position P is $P = E + R*M1$.

One aspect of position feedback is how the position is measured. Ideally in an impedance tuner, the position feedback should provide the exact position of the movable capacitive object. But some embodiments may use an approximation in the position feedback to save on other factors, such as size, complexity, and/or cost. For example, if a motor with a rotary encoder is used to move the capacitive object with a lead screw and nut, the position feedback read from the rotary encoder will actually be the rotary position of the motor shaft, not the actual position of the capacitive object. Errors due to thread imperfections in the lead screw and nut combination will not be detected. However, the position feedback will still be indicative of the capacitive object position, and the rotary encoder embodiment may be relatively compact and low cost. If the mechanical coupling between the motor shaft and the capacitive object is fairly tight, the errors due to this approximate method of feedback may be sufficiently accurate. Other movement errors due to motor drive failure or incomplete movement due to friction or blockages will be detected. Also, the complete impedance tuner embodiment could include a combination, where some motors use rotary encoders, and other motors use linear encoders that measure the actual carriage position.

Figure 4:
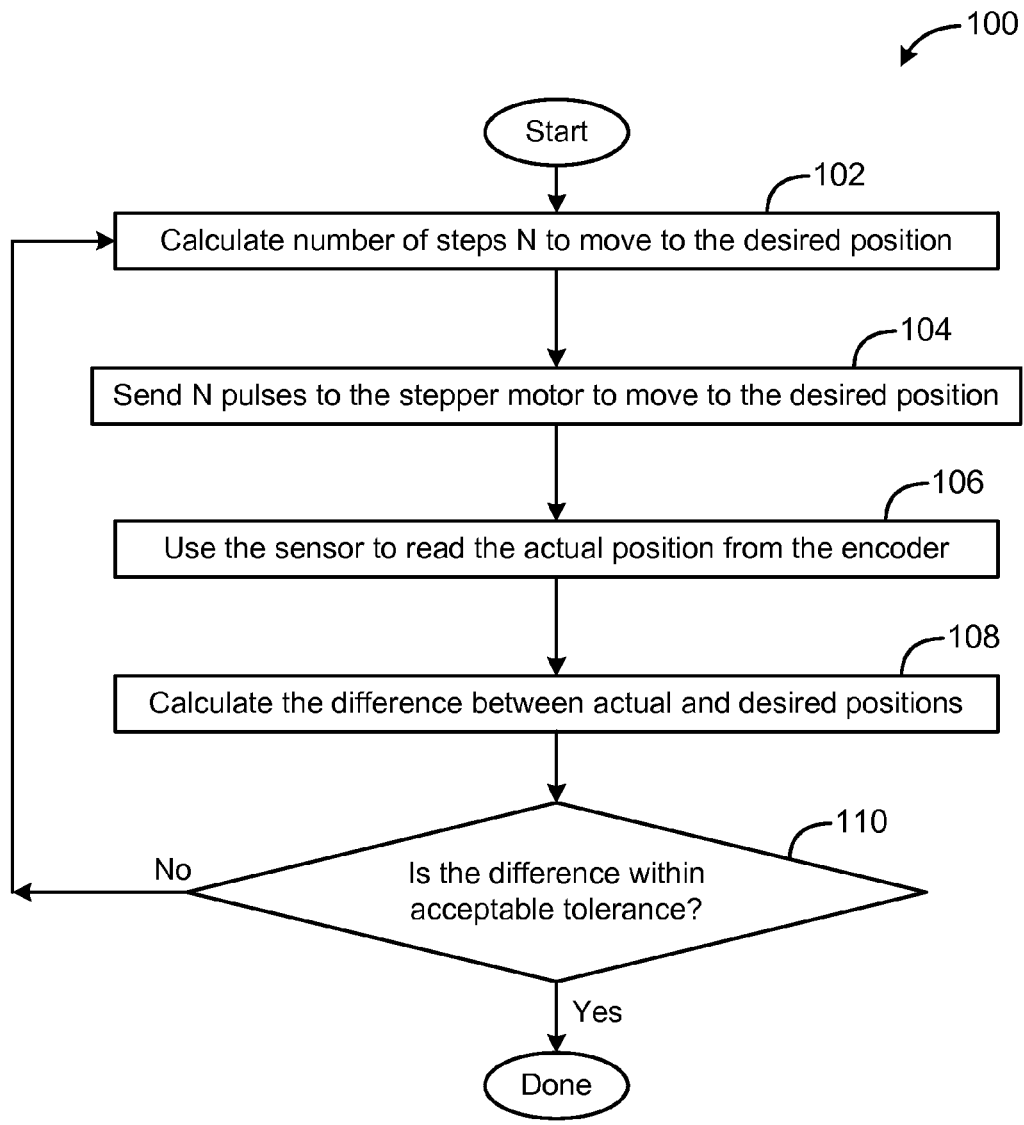
FIG. 4 is a flow diagram showing an exemplary embodiment of a procedure for moving a motor to a desired position using an absolute encoder.
Figure 5:
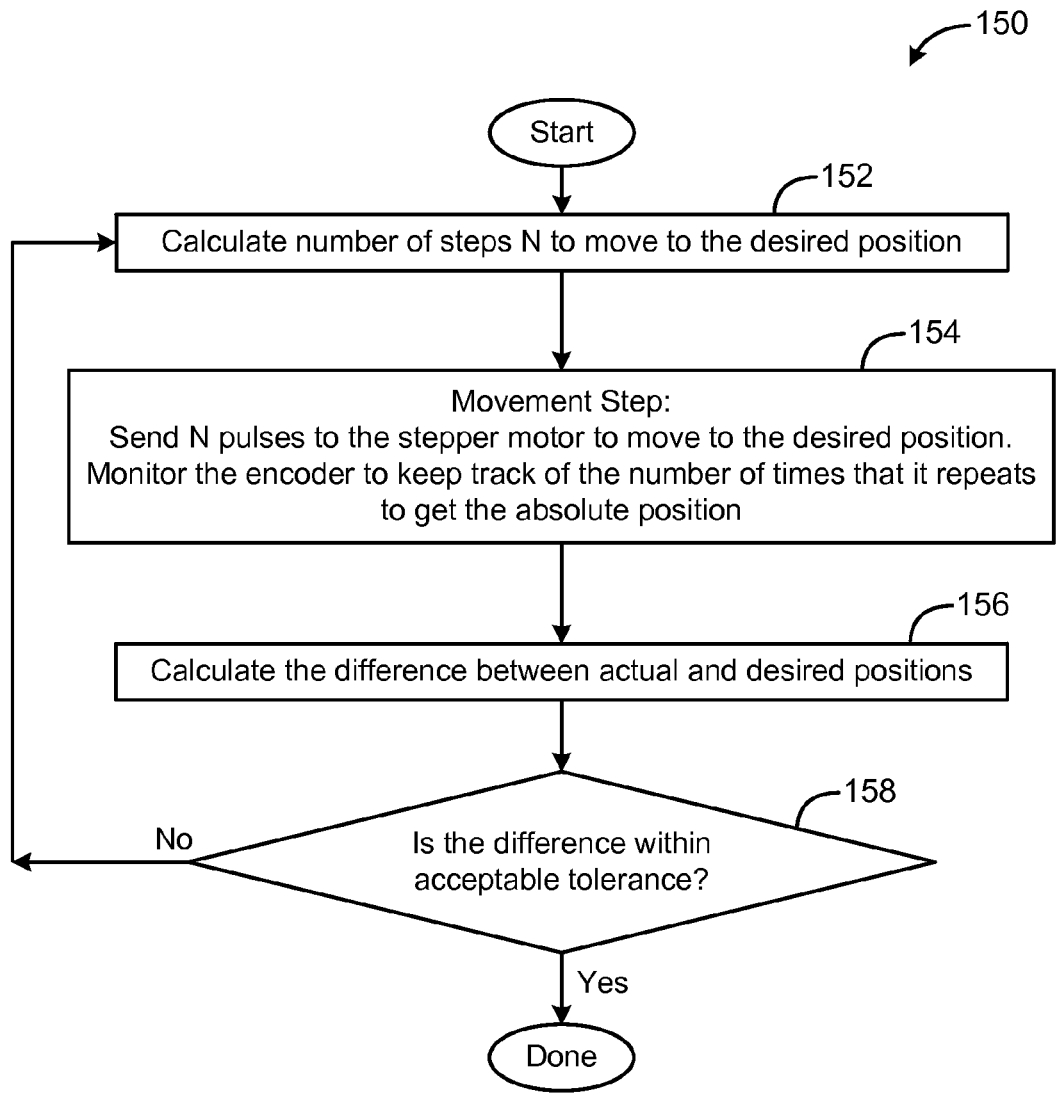
FIG. 5 is a flow diagram showing an exemplary embodiment of a procedure for moving a motor to a desired position using a relative encoder.
Figure 6:
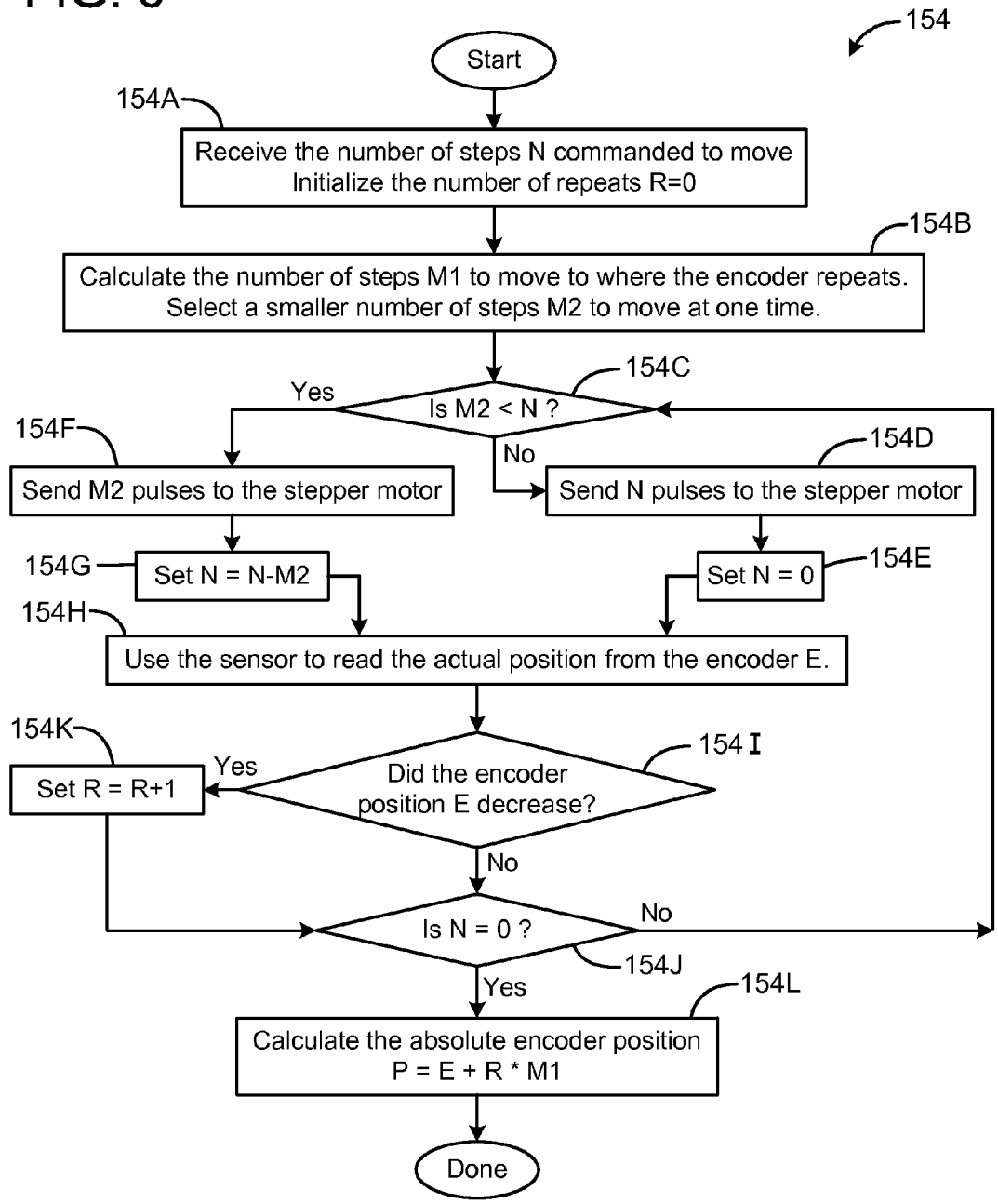
FIG. 6 is a flow diagram showing details of an exemplary embodiment of a movement step using a relative encoder.

When a software command is initiated by the tuner controller to the motor to move the carriage (or probe), the exemplary algorithm or procedure shown in FIG. 4 is executed by the controller if the encoder is an absolute encoder, or the exemplary algorithm or procedure shown in FIGS. 5 and 6 is executed if the encoder is a relative encoder. In general, the motor moves the carriage until the sensor sees the correct position on the encoder scale. The sensor detects the encoder scale position and signals that the position has been reached. If the software detects that the position of the carriage is not in the correct place, the motor is given a command to reverse or forward the movement until the correct position is achieved. This is considered the feedback loop of the system.

FIG. 4 shows an exemplary algorithm 100 executed by the impedance tuner controller to move the movable piece, such as a probe carriage or probe, to a desired position using an absolute encoder and a feedback loop. At step 102, the number N of motor steps to move the movable piece to the desired position is calculated. At step 104, the controller causes N pulses to be sent to the stepper motor to move to the desired position. At 106, the sensor is read to determine from the location the actual position of the movable piece. At 108, the difference between the actual position and the desired position is calculated. If the difference (110) is within an acceptable tolerance, the movement is completed. If not, then operation returns to 102 to calculate the number of steps to move from the actual position to the desired position, and the process repeats.

FIG. 5 illustrates an exemplary algorithm 150 using a feedback loop with a position sensor utilizing a relative encoder. The algorithm starts with receipt of a command to move the movable piece to a desired location by controlling a stepper motor coupled to the movable piece. At step 152, the number of steps N to move to the desired location from the present location is calculated. At 154, the movement step, N pulses are sent to the stepper motor to move to the desired location. The encoder is monitored during this step to keep track of the number of times it repeats to get the absolute position. At 156, the difference between the actual and the desired positions is calculated. At 158, if the difference is within an acceptable tolerance, the move is deemed complete. If the difference exceeds the threshold, the process returns to step 152.

FIG. 6 illustrates an exemplary embodiment of the movement step 154 of the algorithm 150 in further detail. At 154A, the number of steps N commanded to move is received, and the number of repeats R is initialized to zero. At 154B, the number of steps M1 to move to where the encoder repeats is calculated. A smaller number M2 of steps is selected to move at one time. If M2 is less than N (step 154C), M2 pulses are sent to the stepper motor (154F), and N is set to N−M2 (154G). If M2 is not less than N, N pulses are sent to the stepper motor (154D) and N is set to zero (154E). At 154H, the position sensor reads the actual position E from the encoder. If the encoder position decreased (154I), R is set to R+1 (step 154K), and the process proceeds to step 154J. Here, if N is not equal to 0, operation returns to step 154C. If N=0, the absolute encoder position P is set to E+R*M1 (154L), and the move is completed.

By using a feedback loop when moving a capacitive object in an impedance tuner, the positioning error in the motor/screw system is reduced, giving movement results with higher accuracy and repeatability.

Positional feedback may be more important for one motor axis than another, and therefore an acceptable and economical solution may be to use position feedback on one axis (or more), but not on every axis. For example, the capacitive object may be very light weight, and easy for the transverse motor to move, while the carriage motor could be more susceptible to missing pulses since it must generally move more mass.

Concurrently, if a limitation that prevents movement occurs, such as a blockage or frictional lockup, the position sensor can detect this and send an error message to the controller.

Along with any errors that occur, the sensor can determine what error was seen. If the position is missed, and continued commands to find a correct position do not result in finding the position, an error in position can be sent back to the controller software. For example, if a blockage occurs and the carriage is not able to achieve its intended position, on a first pass basis, and no further movement can be accomplished, then a "jam" error can be sent to the software.

FIG. 3 diagrammatically illustrates positional location using a screw/nut system and encoder scale system. The positional repeatability error in the screw/nut combination is more prevalent if a particular desired position is approached one time from one direction, and approached another time from the opposite direction. With feedback loop movement, controlled by the tuner controller reading the sensor and driving the carriage motor, the motor will move the carriage until it lines up to the sensor reading on the encoder scale. Errors are significantly reduced.

Another advantage of using position feedback is that motor types other than stepper motors may be used. For example, DC motors may be used in a servo loop, and this may provide faster and smoother movement, often with smaller motors.

Although the foregoing has been a description and illustration of specific embodiments of the subject matter, various modifications and changes thereto can be made by persons skilled in the art without departing from the scope and spirit of the invention.

What is claimed is:

1. An impedance tuner, comprising:
   a controller;
   an RF transmission line;
   a movable capacitive object configured for movement commanded by the controller relative to the transmission line to alter impedance;
   a position sensor configured to provide position feedback data to the controller indicative of actual positions of the capacitive object after it is moved; and
   wherein the controller is configured to utilize the position feedback data in a closed loop to position the capacitive object at a desired position within a tolerance.

2. The tuner of claim 1, wherein the capacitive object is configured for movement in a direction parallel to the transmission line.

3. The tuner of claim 1, where the capacitive object is configured for movement in a direction transverse to the transmission line.

4. The tuner of claim 1, comprising a screw/nut drive for driving a carriage along an axis parallel to the tuner transmission line, wherein the capacitive object is mounted to the carriage, and wherein the controller and position sensor are configured to compensate for errors inherent in the screw/nut drive.

5. The tuner of claim 1, comprising a motorized gear engaging a linear rack gear for driving the carriage along an axis parallel to the tuner transmission line, wherein the capacitive object is mounted to the carriage, and wherein the controller and position sensor are configured to compensate for errors introduced by the motorized gear and linear rack gear.

6. The tuner of claim 1, wherein the position sensor comprises an encoder scale and a sensor for reading the encoder scale.

7. The tuner of claim 1, wherein the position sensor includes a linear encoder.

8. The tuner of claim 1, wherein the position sensor includes a rotary encoder.

9. The tuner of claim 1, where the impedance tuner has multiple motors to move the capacitive object in multiple axis, including parallel to the transmission line and transverse to the transmission line.

10. The tuner of claim 9, where each of said multiple motors uses a position sensor to provide position feedback data for closed loop operation.

11. The tuner of claim 9, where at least one of the multiple motors uses a position sensor to provide position feedback data, and at least one of the multiple motors does not use a position sensor to provide position feedback data.

12. An impedance tuner, comprising:
a controller;
a transmission line;
a capacitive object which is configured for movement relative to the transmission line to alter impedance;
a motor coupled to the capacitive object and configured to move the capacitive object in response to commands from the controller;
a position sensor configured to provide position data to the controller indicative of actual positions of the capacitive object relative to the transmission line, and wherein said motor is a motor type other than a stepper motor; and
wherein the controller is configured to utilize the position data in a feedback loop to position the capacitive object at desired positions within a tolerance.

13. The tuner of claim 12, wherein said motor type in the tuner is a DC motor.

14. An impedance tuner for presenting a variable impedance to a device under test, comprising:
a controller;
an RF transmission line;
a carriage movable along a first axis parallel to the transmission line;
a movable capacitive object configured for movement commanded by the controller relative to the transmission line to alter impedance;
a motorized drive system configured to move the capacitive object along a first axis parallel to the transmission line, and along a second axis transverse to the transmission line, the drive system including a first motor drive coupled to the carriage for moving the carriage along the first axis, and a second motor drive mounted to the carriage and coupled to the capacitive object for moving the capacitive object in directions transverse to the transmission line;
a position sensor configured to provide position feedback data to the controller indicative of actual positions of the capacitive object along the first axis after it is moved; and
wherein the controller is configured to utilize the position feedback data in a closed loop to position the capacitive object at a desired position along the first axis within a tolerance.

15. The impedance tuner of claim 14, wherein the first motor drive comprises a screw/nut drive, wherein the controller and position sensor are configured to compensate for errors inherent in the screw/nut drive.

16. The impedance tuner of claim 14, wherein the first motor drive comprises a motor-driven gear engaging a linear rack gear for driving the carriage along said first axis, and wherein the controller and position sensor are configured to compensate for errors introduced by the motor-driven gear and linear rack gear.

17. The impedance tuner of claim 14, wherein the second motor drive comprises a second motor, with a second position sensor including a rotary encoder to sense motor shaft movement, the second position sensor configured to provide a second position signal to the controller which is indicative of a position of the movable capacitive object in relation to the transmission line, and the controller is configured to compensate errors introduced by the second motor drive.

18. The impedance tuner of claim 14, wherein the position sensor includes a linear encoder.

19. The tuner of claim 14, wherein the position sensor includes a rotary encoder.

* * * * *